(12) United States Patent
Huang et al.

(10) Patent No.: US 12,150,242 B2
(45) Date of Patent: Nov. 19, 2024

(54) LED CIRCUIT BOARD STRUCTURE AND LED TESTING AND PACKAGING METHOD

(71) Applicant: INGENTEC CORPORATION, Miaoli County (TW)

(72) Inventors: Yi-Chuan Huang, Miaoli County (TW); Hsiao-Lu Chen, Miaoli County (TW); Ai-Sen Liu, Miaoli County (TW)

(73) Assignee: INGENTEC CORPORATION, Miaoli County (TW)

( * ) Notice: Subject to any disclaimer, the term of this patent is extended or adjusted under 35 U.S.C. 154(b) by 189 days.

(21) Appl. No.: 17/932,673

(22) Filed: Sep. 16, 2022

(65) Prior Publication Data
US 2024/0008170 A1 Jan. 4, 2024

(30) Foreign Application Priority Data
Jun. 29, 2022 (TW) .................................. 111124308

(51) Int. Cl.
*H05K 1/02* (2006.01)
*H05K 1/11* (2006.01)
(Continued)

(52) U.S. Cl.
CPC .......... *H05K 1/0268* (2013.01); *H05K 1/115* (2013.01); *H05K 3/0044* (2013.01); *H05K 3/306* (2013.01);
(Continued)

(58) Field of Classification Search
CPC ....... G09G 2320/0693; G09G 2330/10; G09G 2330/12; G09G 3/32; H01L 25/0753; H01L 33/62; H05K 1/0268; H05K 1/115; H05K 1/02; H05K 1/11; H05K 2201/10106; H05K 2203/0228; H05K 2203/162; H05K 3/0044; H05K 3/306; H05K 3/00; H05K 3/30
(Continued)

(56) References Cited

U.S. PATENT DOCUMENTS

2005/0229126 A1* 10/2005 Wang ..................... G06F 30/398
716/112
2017/0373114 A1* 12/2017 Wan .................. H01L 27/14629
(Continued)

FOREIGN PATENT DOCUMENTS

CN 106205401 A * 12/2016 ............... G09F 9/33
JP 2007-157761 A 6/2007
(Continued)

*Primary Examiner* — Timothy J Thompson
*Assistant Examiner* — Guillermo J Egoavil
(74) *Attorney, Agent, or Firm* — CKC & Partners Co., LLC

(57) ABSTRACT

An LED circuit board structure includes first color LEDs, second color LEDs, third color LEDs, a carrier board, first testing wires, first connecting wires, second testing wires and second connecting wires. Each of the first testing wire is located at the carrier board and electrically connects two first color LEDs in a pixel-front-side-pattern region in parallel. The first connecting wire electrically connects two first testing wires in adjacent two pixel-front-side-pattern regions. Each of the second testing wire is located at the carrier board and electrically connects two second color LEDs in a pixel-front-side-pattern region in parallel. The second connecting wire electrically connects two second testing wires in adjacent two pixel-front-side-pattern regions.

7 Claims, 9 Drawing Sheets

(51) Int. Cl.
*H05K 3/00* (2006.01)
*H05K 3/30* (2006.01)
(52) U.S. Cl.
CPC .............. *H05K 2201/10106* (2013.01); *H05K 2203/0228* (2013.01); *H05K 2203/162* (2013.01)
(58) Field of Classification Search
USPC .......................................................... 361/761
See application file for complete search history.

(56) References Cited

U.S. PATENT DOCUMENTS

2018/0254226 A1\* 9/2018 Iguchi ................... H01L 27/156
2021/0398954 A1\* 12/2021 Gu ......................... H01L 23/544

FOREIGN PATENT DOCUMENTS

| JP | 2011-199221 A | 10/2011 |
| JP | 2014-072330 A | 4/2014 |
| JP | 2016-058674 A | 4/2016 |
| JP | 2019-220726 A | 12/2019 |
| JP | 2020-053274 A | 4/2020 |
| JP | 6914457 B1 | 8/2021 |

\* cited by examiner

2000

LED CIRCUIT BOARD STRUCTURE AND LED TESTING AND PACKAGING METHOD

RELATED APPLICATIONS

This application claims priority to Taiwan Application Serial Number 111124308, filed Jun. 29, 2022, which is herein incorporated by reference.

BACKGROUND

Technical Field

The present disclosure relates to a circuit board structure, a testing and packaging method and a pixel package. More particularly, the present disclosure relates to an LED circuit board structure, an LED testing and packaging method and an LED pixel package.

Description of Related Art

With the popularization of personal display devices, the miniaturization of LED (light emitting diode) structures has become a trend in the industry. As the sizes of the LEDs scale down, the sizes of the LED pixel packages are reduced accordingly. Generally speaking, in the manufacturing process of the display, the LED pixel packages are mounted on the display substrate one by one. In order to save the cost of mounting, the structure of combining multiple pixels into one LED pixel package has been developed and has gradually become a mainstream.

To ensure the yield rate, LED pixel packages need to be tested. In the conventional LED pixel packaging and testing technology, the LED pixel packages are tested one by one after sealing. However, the small size and large number of LED pixel packages make the measurements difficult and time-consuming. In addition, if a defect is found after sealing, the entire LED pixel package has to be discarded, resulting in a waste of cost. Therefore, to improve the testing efficiency of the LED pixel package and to save the cost are the goals to be achieved in the related field.

SUMMARY

According to one aspect of the present disclosure, an LED circuit board structure includes a plurality of first color LEDs, a plurality of second color LEDs, a plurality of third color LEDs, a carrier board, a plurality of first testing wires, a plurality of first connecting wires, a plurality of second testing wires, and a plurality of second connecting wires. Each of the first color LEDs includes a first P-type electrode and a first N-type electrode. Each of the second color LEDs includes a second P-type electrode and a second N-type electrode. Each of the third color LEDs includes a third P-type electrode and a third N-type electrode. The carrier board includes a carrying surface and a bottom surface opposite to each other. The carrying surface includes a plurality of pixel-front-side-pattern regions disposed in intervals. The bottom surface includes a plurality of pixel-back-side-pattern regions respectively correspond to the pixel-front-side-pattern regions. At least two of the first color LEDs, at least two of the second color LEDs and at least two of the third color LEDs are disposed in one of the pixel-front-side-pattern regions. One of the first color LEDs, one of the second color LEDs and one of the third color LEDs in the one of the pixel-front-side-pattern regions form a sub-pixel. The first testing wires are located at the carrier board, and each of the first testing wires electrically connects the at least two of the first color LEDs in each of the pixel-front-side-pattern regions in parallel. Each of the first connecting wires electrically connects two of the first testing wires of adjacent two of the pixel-front-side-pattern regions. The second testing wires are located at the carrier board, and each of the second testing wires electrically connects the at least two of the second color LEDs in each of the pixel-front-side-pattern regions in parallel. Each of the second connecting wires electrically connects two of the second testing wires of adjacent two of the pixel-front-side-pattern regions.

According to another aspect of the present disclosure, an LED testing and packaging method includes an LED mounting step, an LED testing step and a carrier board cutting step. In the LED mounting step, a plurality of first color LEDs, a plurality of second color LEDs and a plurality of third color LEDs are mounted to a circuit board. The circuit board includes a carrier board, a plurality of first wire sets, a plurality of second wire sets and a plurality of cutting lanes. The carrier board includes a carrying surface and a bottom surface opposite to each other. The carrying surface includes a plurality of pixel-front-side-pattern regions disposed in intervals. The bottom surface includes a plurality of pixel-back-side-pattern regions respectively correspond to the pixel-front-side-pattern regions. At least two first color LED pads, at least two second color LED pads and at least two third color LED pads are disposed in one of the pixel-front-side-pattern regions. Each of the first color LED pads, each of the second color LED pads and each of the third color LED pads are for mounting electrodes with same electric polarity of each of the first color LEDs, each of the second color LEDs and each of the third color LEDs. Each of the first wire sets electrically connects the first color LED pads disposed at each of the pixel-front-side-pattern regions in parallel. Each of the second wire sets electrically connects the second color LED pads disposed at each of the pixel-front-side-pattern regions in parallel. The cutting lanes are located at the carrier board and are located between each of the pixel-front-side-pattern regions. A part of the first wire sets and a part of the second wire sets are located at the cutting lanes. In the LED testing step, the first wire sets are powered to test each of the first color LEDs and the second wire sets are powered to test each of the second color LEDs. In carrier board cutting step, the carrier board is cut along the cutting lanes such that the pixel-front-side-pattern regions separate from each other and the first wire sets and the second wire sets are cutting off to form a plurality of pixels to be packaged.

According to still another aspect of the present disclosure, an LED pixel package includes a carrier board, a plurality of first color LEDs, a plurality of second color LEDs, a plurality of third color LEDs, a sealing layer and a first wire set. The carrier board includes a carrying surface. The first color LEDs are disposed on the carrying surface. The second color LEDs are disposed on the carrying surface. The third color LEDs are disposed on the carrying surface. The sealing layer covers the first color LEDs, the second color LEDs and the third color LEDs. The first wire set is disposed at the carrying surface and electrically connects at least a part of the first color LEDs. A part of the first wire set extends to an edge of the carrier board. A top surface of the part is higher than the carrying surface of the carrier board to form a metal break surface at the edge.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
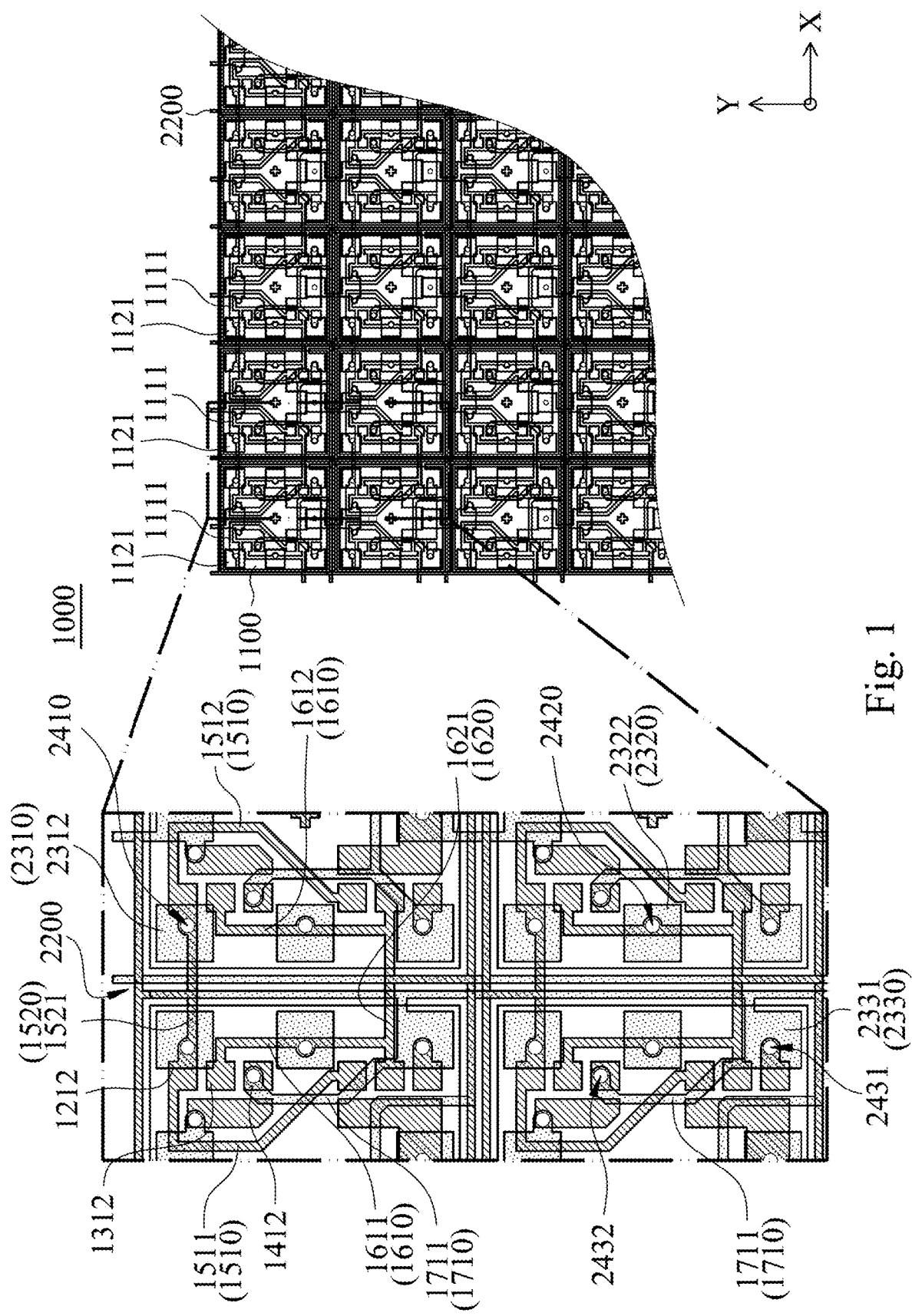
FIG. 1 is a top perspective view of an LED circuit board structure according to one embodiment of the present disclosure.
Figure 2:
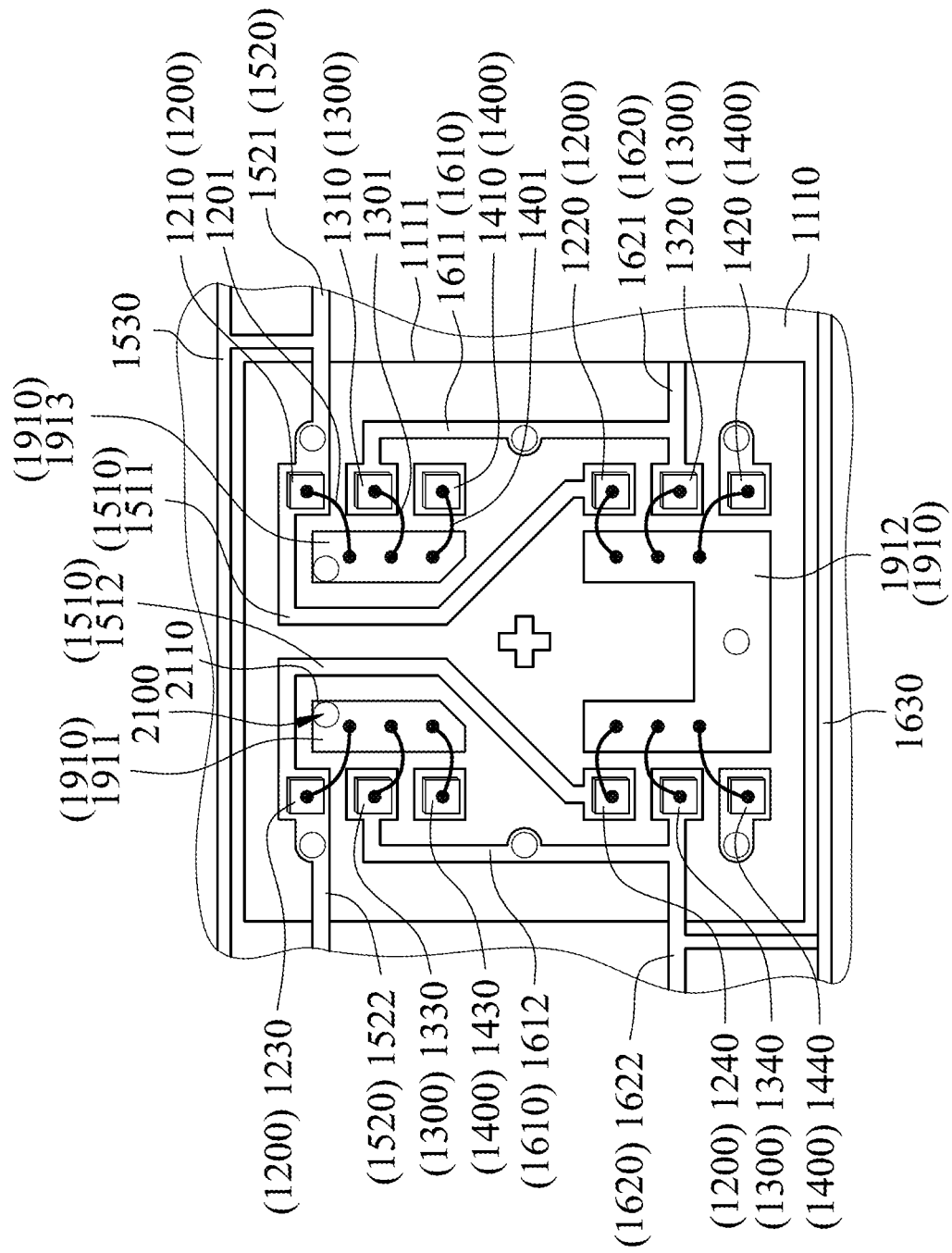
FIG. 2 is a pixel-front-side-pattern region of the LED circuit board structure according to FIG. 1.
Figure 3:
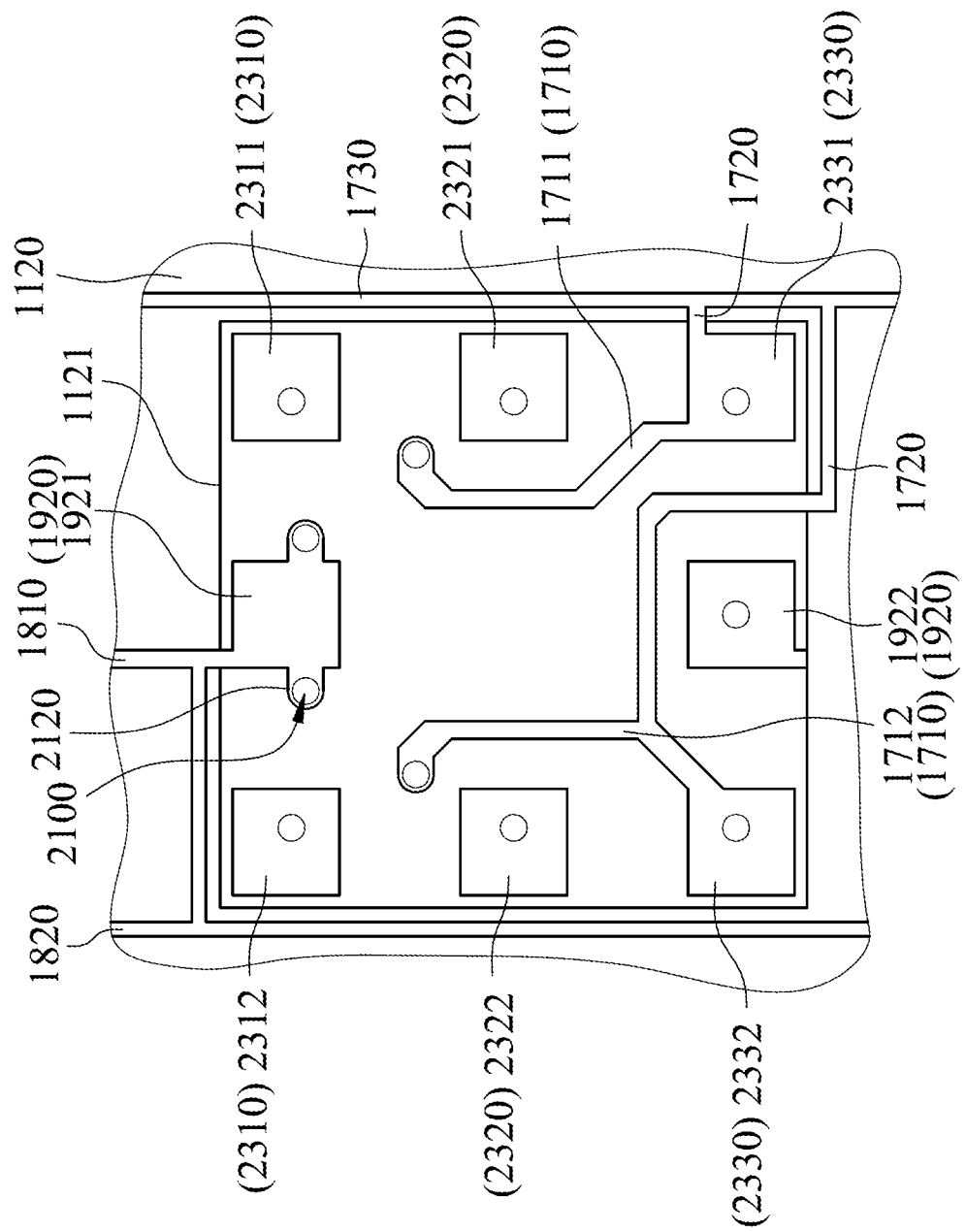
FIG. 3 is a pixel-back-side-pattern region of the LED circuit board structure according to FIG. 1.

FIG. 1 is a top perspective view of an LED circuit board structure 1000 according to one embodiment of the present disclosure. FIG. 2 is a pixel-front-side-pattern region 1111 of the LED circuit board structure 1000 according to FIG. 1. FIG. 3 is a pixel-back-side-pattern region 1121 of the LED circuit board structure 1000 according to FIG. 1. In FIG. 1 to FIG. 3, the LED circuit board structure 1000 includes a plurality of first color LEDs 1200, a plurality of second color LEDs 1300, a plurality of third color LEDs 1400, a carrier board 1100, a plurality of first testing wires 1510, a plurality of first connecting wires 1520, a plurality of second testing wires 1610, and a plurality of second connecting wires 1620. The carrier board 1100 includes a carrying surface 1110 and a bottom surface 1120 opposite to each other. The carrying surface 1110 includes a plurality of pixel-front-side-pattern regions 1111 disposed in intervals. The bottom surface 1120 includes a plurality of pixel-back-side-pattern regions 1121 respectively correspond to the pixel-front-side-pattern regions 1111. At least two first color LEDs 1200, at least two second color LEDs 1300 and at least two third color LEDs 1400 are disposed in one of the pixel-front-side-pattern regions 1111. One of the first color LEDs 1200, one of the second color LEDs 1300 and one of the third color LEDs 1400 in the one of the pixel-front-side-pattern regions 1111 form a sub-pixel. In this embodiment, four first color LEDs 1200, four second color LEDs 1300 and four third color LEDs 1400 are disposed in one pixel-front-side-pattern region 1111, and there are four sub-pixels in one pixel-front-side-pattern region 1111.

In this disclosure, the structures of the first color LEDs 1200, the second color LEDs 1300 and the third color LEDs 1400 can be flip-chips, vertical-chips, etc. In the embodiment of FIG. 1 to FIG. 3, the first color LEDs 1200, the second color LEDs 1300 and the third color LEDs 1400 are vertical-chips. Each of the first color LEDs 1200 includes a first P-type electrode and a first N-type electrode. For example, in the first color LEDs 1200 in FIG. 1 to FIG. 3, the electrode which is close to the carrying surface 1110 of the carrier board 1100 and is mounted on the carrier board 1100 can be the first P-type electrode, and the electrode which is away from the carrying surface 1110 of the carrier board 1100 and is connected to the carrier board 1100 by a conducting wire 1201 can be the first N-type electrode. Similarly, each of the second color LEDs 1300 includes a second P-type electrode and a second N-type electrode, each of the third color LEDs 1400 includes a third P-type electrode and a third N-type electrode, and conducting wires 1301, 1401 are respectively used to connect the second N-type electrode and the third N-type electrode to the carrier board 1100.

The relationships between the first testing wires 1510, the first connecting wires 1520 and the first color LEDs 1200 and the relationships between the second testing wires 1610, the second connecting wires 1620 and the second color LEDs 1400 are illustrated with the partial enlarged view of FIG. 1 and FIG. 2. In the repeated regions of the LED circuit board structure 1000, the relationships between the above elements are similar. For better illustrating, the first color LEDs 1200 are further distinguished as first color LEDs 1210, 1220, 1230, 1240, the second color LEDs 1300 are further distinguished as second color LEDs 1310, 1320, 1330, 1340, the first testing wires 1510 are further distinguished as first testing wires 1511, 1512, and the second testing wires 1610 are further distinguished as second testing wires 1611, 1612. The first testing wire 1511 electrically connects the two first color LEDs 1210, 1220 in the same pixel-front-side-pattern region 1111 in parallel, and the first testing wire 1512 electrically connects the two first color LEDs 1230, 1240 in the same pixel-front-side-pattern region 1111 in parallel. The first connecting wire 1520 electrically connects the first testing wires 1511, 1512 of adjacent two pixel-front-side-pattern regions 1111. The second testing wire 1611 electrically connects the two second color LEDs 1310, 1320 in the same pixel-front-side-pattern region 1111 in parallel, and the second testing wire 1612 electrically connects the two second color LEDs 1330, 1340 in the same pixel-front-side-pattern region 1111 in parallel. The second connecting wire 1620 electrically connects the second testing wires 1611, 1612 of adjacent two pixel-front-side-pattern regions 1111.

In detail, in the embodiment of FIG. 1 to FIG. 3, two first testing wires 1511, 1512 and two second testing wires 1611, 1612 are disposed at one pixel-front-side-pattern region 1111. The first connecting wires 1520 can be further distinguished as first connecting wires 1521, 1522 which respectively connects the first testing wire 1511 to the first testing wire 1512 of the pixel-front-side-pattern region 1111 on the right side and connects the first testing wire 1512 to the first testing wire 1511 of the pixel-front-side-pattern region 1111 on the left side. The second connecting wires 1620 can be further distinguished as second connecting wires 1621, 1622 which respectively connects the second testing wire 1611 to the second testing wire 1612 of the pixel-front-side-pattern region 1111 on the right side and connects the second testing wire 1612 to the second testing wire 1611 of the pixel-front-side-pattern region 1111 on the left side. Further, the LED circuit board structure 1000 includes first data wires 1530 and second data wires 1630. The first connecting wires 1521, 1522 each connects to the same first data wire 1530 to connect the first color LEDs 1200 in the pixel-front-side-pattern regions 1111 of the same row arranged along the first direction X in parallel. The second color LEDs 1300 are connected in parallel in a similar way.

Through the structures of the first testing wires 1510, the first connecting wires 1520, the second testing wires 1610 and the second connecting wires 1620, the first color LEDs 1200 in the same pixel-front-side-pattern region 1111 are connected in parallel, the first color LEDs 1200 in adjacent pixel-front-side-pattern regions 1111 are connected in parallel, the second color LEDs 1300 in the same pixel-front-side-pattern region 1111 are connected in parallel, and the second color LEDs 1300 in adjacent pixel-front-side-pattern regions 1111 are connected in parallel. Therefore, an electric voltage can be applied on the first P/N-type electrodes of multiple first color LEDs 1200 or on the second P/N-type electrodes of multiple second color LEDs 1300, and when one of the first color LEDs 1200 or one of the second color LEDs 1300 fails, the electric voltage applied to other first color LEDs 1200 or second color LEDs 1300 is not affected. In other words, since the first color LEDs 1210, 1220, 1230, 1240 are connected in parallel, when the first color LED 1210 fails and the first color LEDs 1220, 1230, 1240 are normal, only the first color LED 1210 fails to illuminate, and the first color LEDs 1220, 1230, 1240 still illuminate. Therefore, the efficiency of testing the first color LEDs 1200 and testing the second color LEDs 1300 is improved.

In FIG. 1 to FIG. 3, the LED circuit board structure 1000 further includes a plurality of third testing wires 1710 and a plurality of third connecting wires 1720. The third testing wires 1710 are located at the bottom surface 1120 of the carrier board 1100, and are located at the pixel-back-side-pattern regions 1121. Similarly, for better illustrating, the third testing wires 1510 are further distinguished as third testing wires 1711, 1712, and the third color LEDs 1400 are further distinguished as third color LEDs 1410, 1420, 1430, 1440. The third testing wire 1711 electrically connects the two third color LEDs 1410, 1420 in the same pixel-front-side-pattern region 1111 in parallel, and the third testing wire 1512 electrically connects the two third color LEDs 1430, 1440 in the same pixel-front-side-pattern region 1111 in parallel. The third connecting wire 1720 electrically connects two of the third testing wires 1711, 1712 of adjacent two of the pixel-back-side-pattern regions 1121.

In detail, in the embodiment of FIG. 1 to FIG. 3, two third testing wires 1711, 1712 are disposed at one pixel-back-side-pattern region 1121. The third testing wires 1711, 1712 of the pixel-back-side-pattern regions 1121 of the same column arranged along the second direction Y are electrically connected to the third data wire 1730 through the third connecting wire 1720 to connect the third color LEDs 1400 in the pixel-front-side-pattern regions 1111 of the same column arranged along the second direction Y in parallel.

Through the structures of the third testing wires 1710 and the third connecting wires 1720, the third color LEDs 1400 in the same pixel-front-side-pattern region 1111 are connected in parallel, and the third color LEDs 1400 in adjacent pixel-front-side-pattern regions 1111 are connected in parallel. Therefore, an electric voltage can be applied on the third P/N-type electrodes of multiple third color LEDs 1400, and when one of the third color LEDs 1400 fails, the electric voltage applied to other third color LEDs 1400 is not affected. Therefore, the efficiency of testing the third color LEDs 1400 is improved.

In the embodiment of FIG. 1 to FIG. 3, the LED circuit board structure 1000 further includes a plurality of front-side electrode pads 1910, a plurality of conducting holes 2100 and a plurality of fourth connecting wires 1810. The front-side electrode pads 1910 are located at the carrying surface 1110 of the carrier board 1100. At least one front-side electrode pads 1910 are located at one pixel-front-side-pattern region 1111. The front-side electrode pads 1910 in one pixel-front-side-pattern region 1111 electrically connects the first color LED 1200, the second color LED 1300 and the third color LED 1400 in one sub-pixel of the pixel-front-side-pattern region 1111. The conducting holes 2100 penetrate the carrier board 1100. The upper end 2110 of at least one of the conducting hole 2100 is located at one pixel-front-side-pattern region 1111 and electrically connects the front-side electrode pad 1910 of the pixel-front-side-pattern region 1111. The lower end 2120 of at least one of the conducting hole 2100 is located at one pixel-back-side-pattern region 1121. The fourth connecting wires 1810 are located at the bottom surface 1120 of the carrier board 1100 and each electrically connects the lower end of the conducting holes 2100 of adjacent two pixel-back-side-pattern regions 1121.

For better illustrating, the front-side electrode pads 1910 are further distinguished as front-side electrode pads 1911, 1912, 1913. As shown in FIG. 1 to FIG. 3, the front-side electrode pads 1911, 1912, 1913 are located at each pixel-front-side-pattern regions 1111. In the embodiment, the first color LEDs 1210, 1220, 1230, 1240, the second color LEDs 1310, 1320, 1330, 1340 and the third color LEDs 1410, 1420, 1430, 1440 are vertical-chips, and the first P-type electrodes of the first color LEDs 1210, 1220, 1230, 1240, the second electrodes of the second color LEDs 1310, 1320, 1330, 1340 and the third electrodes of the third color LEDs 1410, 1420, 1430, 1440 are respectively and directly mounted on the first color LED pads 1212, the second color LED pads 1312 and the third color LED pads 1412. The first N-type electrode of the first color LED 1210, the second N-type electrode of the second color LED 1310 and the third N-type electrode of the third color LED 1410 are respectively bridged over to the front-side electrode pad 1913 through the conducting wires 1201, 1301, 1401; the first N-type electrodes of the first color LEDs 1220, 1240, the second N-type electrodes of the second color LEDs 1320, 1340 and the third N-type electrodes of the third color LEDs 1420, 1440 are respectively bridged over to the front-side electrode pad 1912 through the conducting wires 1201, 1301, 1401; the first N-type electrode of the first color LED 1230, the second N-type electrode of the second color LED 1330 and the third N-type electrode of the third color LED 1430 are respectively bridged over to the front-side electrode pad 1911 through the conducting wires 1201, 1301, 1401. The first color LED pads 1212 electrically connect the first testing wires 1510, the second color LED pads 1312 electrically connect the second testing wires 1610, and the third color LED pads 1412 electrically connect the third testing wires 1710.

In detail, the LED circuit board structure 1000 further includes a plurality of first electrode pads 2310, a plurality of second electrode pads 2320, a plurality of third electrode pads 2330 and a plurality of back-side electrode pads 1920, which are located at the bottom surface 1120 of the carrier board 1100. At least one of the first electrode pad 2310, at least one of the second electrode pad 2320, at least one of the third electrode pad 2330 and at least one of the back-side electrode pad 1920 are located at each of the pixel-back-side-pattern regions 1121. One first electrode pad 2310 of one pixel-back-side-pattern region 1121 electrically connects two first color LEDs 1200 located at one pixel-front-side-pattern region 1111, one second electrode pad 2320 of one pixel-back-side-pattern region 1121 electrically connects two second color LEDs 1300 located at one pixel-front-side-pattern region 1111, one third electrode pad 2330 of one pixel-back-side-pattern region 1121 electrically connects two third color LEDs 1400 located at one pixel-front-side-pattern region 1111, and one back-side electrode pad 1920 of one pixel-back-side-pattern regions 1121 electrically connects two first color LEDs 1200, two second color LEDs 1300 and two third color LEDs 1400 located at one pixel-front-side-pattern region 1111. Precisely, as shown in FIGS. 1 and 2, a conducting hole 2410 is connected between the first electrode pad 2312 of one pixel-back-side-pattern region 1121 and the first testing wire 1512 of one pixel-front-side-pattern region 1111, and because the two first color LEDs 1230, 1240 are electrically connected to the first testing wire 1512, the first electrode pad 2312 is electrically connected to the two first color LEDs 1230, 1240. A conducting hole 2420 is connected between the second electrode pad 2322 of one pixel-back-side-pattern region 1121 and the second testing wire 1612 of one pixel-front-side-pattern region 1111, and because the two second color LEDs 1330, 1340 are electrically connected to the second testing wire 1612, the second electrode pad 2322 is electrically connected to the two second color LEDs 1330, 1340. One end of the third testing wire 1711 is connected to the third electrode pad 2331 of one pixel-back-side-pattern region 1121, and a conducting hole 2431 is connected between the third electrode pad 2331 of one pixel-back-side-pattern region 1121 and the third color LED 1420 of one pixel-front-side-pattern region 1111. A conducting hole 2432 is connected between another end of the third testing wire 1711 of one pixel-back-side-pattern region 1121 and the third color LED 1410 of one pixel-front-side-pattern region 1111. Therefore, the third electrode pad 2331 is electrically connected to the two third color LEDs 1410, 1420.

Further, the first electrode pads 2310 are distinguished as first electrode pads 2311, 2312, the second electrode pads 2320 are distinguished as second electrode pads 2321, 2322, the third electrode pads 2330 are distinguished as third electrode pads 2331, 2332, the back-side electrode pads 1920 are distinguished as back-side electrode pads 1921, 1922. As shown in FIG. 1 to FIG. 3, the first electrode pad 2311 connects the first color LEDs 1210, 1220, the first electrode pad 2312 connects the first color LEDs 1230, 1240, the second electrode pad 2321 connects the second color LEDs 1310, 1320, the second electrode pad 2322 connects the second color LEDs 1330, 1340, the third electrode pad 2331 connects the third color LEDs 1410, 1420, and the third electrode pad 2332 connects the third color LEDs 1430, 1440. The third electrode pads 2331, 2332 of the same pixel-back-side-pattern region 1121 are connected through the third connecting wire 1720. The front-side electrode pads 1911, 1913 are connected to the back-side electrode pad 1921 through one conducting hole 2100. The front-side electrode pad 1912 is connected to the back-side electrode pad 1922 through one conducting hole 2100. The fourth connecting wire 1810 connects the back-side electrode pads 1921, 1922 of adjacent two pixel-back-side-pattern regions 1121.

Through the configuration of the first electrode pads 2310, the second electrode pads 2320, the third electrode pads 2330 and the back-side electrode pads 1920, the LED pixel packages that are cut and sealed can have independent multiple power input pin to control the first color LEDs 1200, the second color LEDs 1300 and the third color LEDs 1400 in different sub-pixels.

By the configuration of this disclosure, the first color LEDs 1200, second color LEDs 1300 and third color LEDs 1400 in the adjacent two pixel-front-side-pattern regions 1111 are respectively and electrically connected in parallel. Therefore, it could be easy to simultaneously apply electric voltages on the first color LEDs 1200, the second color LEDs 1300 and the third color LEDs 1400 of the LED circuit board structure 1000 to fast check whether the first color LEDs 1200, the second color LEDs 1300 and the third color LEDs 1400 are normal or failed. For example, the electric voltage may be applied on first color LEDs 1200 of the same row (arranged in the first direction X). Observation may be taken on each first color LED 1200. Normal first color LEDs 1200 illuminate, and failed first color LEDs 1200 do not illuminate. Then, failed first color LEDs 1200 can be removed and normal first color LEDs 1200 can be reserved according to the results to reduce waste and to save cost. Since the first color LEDs 1200 in the same row are electrically connected in parallel, the failed first color LEDs 1200 do not affect illumination of normal first color LEDs 1200, and good efficiency of inspecting can be achieved. Similar method can be used to check the second color LEDs 1300 and the third color LEDs 1400.

Figure 4:
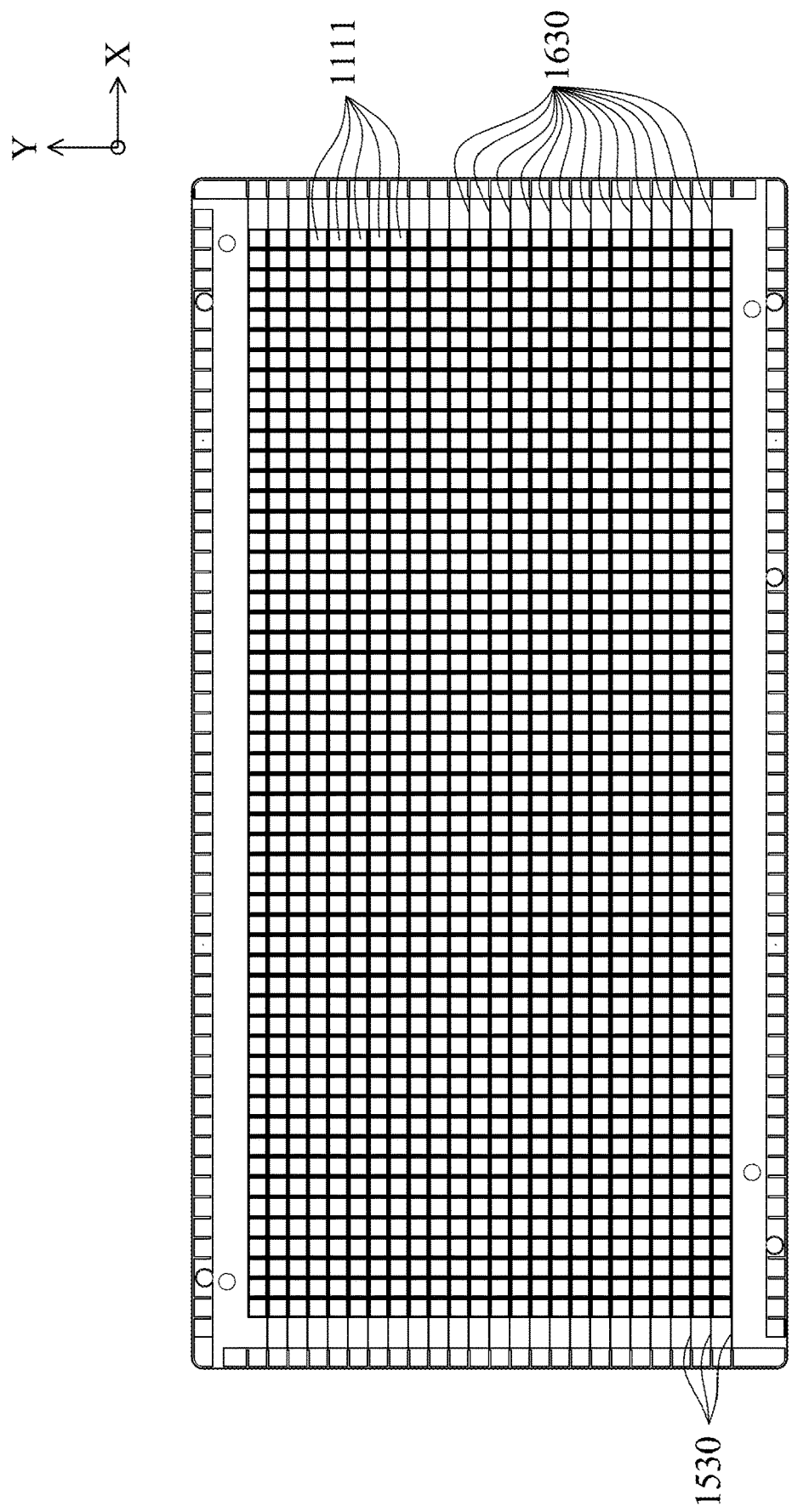
FIG. 4 is a carrying surface of the LED circuit board structure according to FIG. 1.
Figure 5:
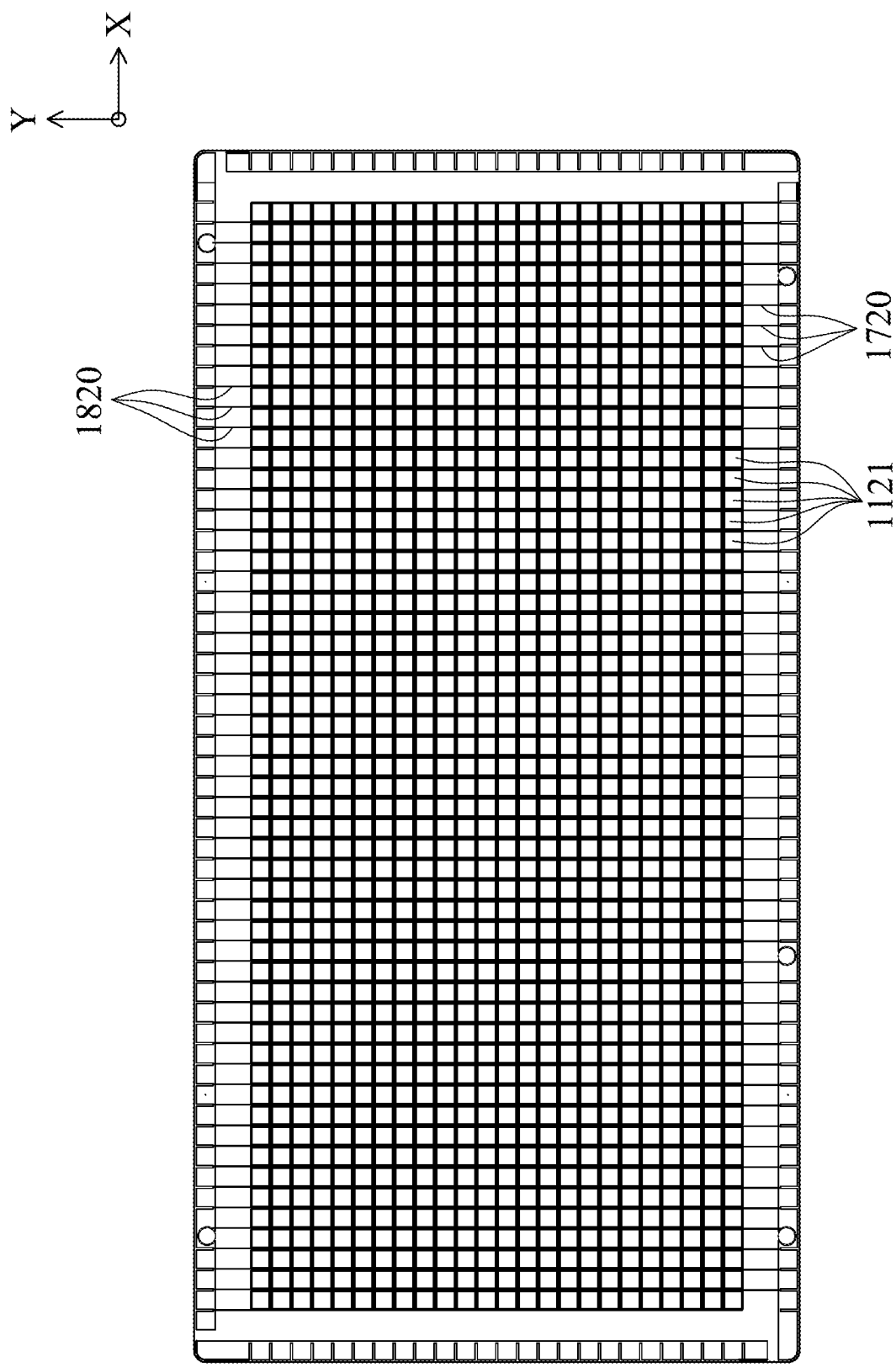
FIG. 5 is a bottom surface of the LED circuit board structure according to FIG. 1.

The wiring of the LED circuit board structure 1000 of this embodiment is further described below. FIG. 4 is a carrying surface 1110 of the LED circuit board structure 1000 according to FIG. 1. FIG. 5 is a bottom surface 1120 of the LED circuit board structure 1000 according to FIG. 1. In this embodiment, the LED circuit board structure 1000 further includes a plurality of fourth data wires 1820 electrically connect the fourth connecting wires 1810. Each of the first data wires 1530 and each of the second data wires 1630 extend to two edges of the carrier board 1100 along the first direction X, and arrange in intervals between the pixel-front-side-pattern regions 1111 in the second direction Y. Each of the third data wires 1730 and each of the fourth data wires 1830 extend to another two edges of the carrier board 1100 along the second direction Y, and arrange in intervals between the pixel-back-side-pattern regions 1121 in the first direction X.

Therefore, fixtures having multiple probes can be clipped on the edge of the carrier board 1100, and each probe can respectively and electrically connect one of first data wires 1530, second data wires 1630, third data wires 1730 and fourth data wires 1820. Signals can be input through the probes to the first color LEDs 1200, the second color LEDs 1300 and the third color LEDs 1400. For example, input signals can be configured to be simultaneously applied on the first color LEDs 1200 of the same row. If all of the first color LEDs 1200 of the same row are normal, then all of the first color LEDs 1200 of the same row illuminate first color lights; if there are first color LEDs 1200 that do not illuminate, then those first color LEDs can be determined to be failed, and can be removed accordingly. Otherwise, input signals can be configured to be applied on the first color LEDs 1200 of the same row by turns. Using automated optical inspection system, the optical image of the LED circuit board structure 1000 corresponding to each moment that the electric voltage being applied to each first color LED 1200 can be captured, analysis can then be carried out to determine whether the nth first color LED 1200 illuminates when the electric voltage applies on, and more precise results can be achieved. Similar methods can be used to test the second color LEDs 1300 and the third color LEDs 1400.

The LED circuit board structure 1000 further includes a plurality of cutting lanes 2200 located at the carrier board 1100 and located between each of the pixel-front-side-pattern regions 1111. The first connecting wires 1520, the second connecting wires 1620, the third connecting wires 1720 and the fourth connecting wires 1810 are located at the cutting lanes 2200. Therefore, the tested LED circuit board structure 1000 can be cut along the cutting lanes such that the first connecting wires 1520, the second connecting wires 1620, the third connecting wires 1720 and the fourth connecting wires 1810 can be cut off, and the parallel electrically connecting relationship between the first color LEDs 1200, the second color LEDs 1300 and the third color LEDs 1400 of different pixel-front-side-pattern regions 1111 can be removed to make each pixel-front-side-pattern regions 1111 turn back to independent status. Through the wiring of the first connecting wires 1520, the second connecting wires 1620, the third connecting wires 1720 and the fourth connecting wires 1810 of this embodiment, the connecting wires can be cut off to avoid short problems. Moreover, a pitch is defined to be the sum of the width of a cutting lane 2200 and the width of a pixel-front-side-pattern region 1111. To efficiently utilizing the area of the carrier board 1100, the ratio between one cutting lane 2200 and one pitch can be designed in a range of 0.11 to 0.155.

To achieve the above benefits, the line widths and the line distances of the wires of the LED circuit board structure 1000 can be adjusted according to the demands. In this embodiment, the line widths of each first data wire 1530, each second data wire 1630, each third data wire 1730 and each fourth data wire 1820 are in a range of 25 μm to 40 μm, and the line distance between one of the first data wires 1530 and one of the second data wires 1630 that are adjacent to each other, and the line distance of one of the third data wires 1730 and one of the fourth data wires 1820 that are adjacent to each other are in a range of 40 μm to 50 μm. In the above ranges, normal operations of the LED circuit board structure 1000 under an operating current can be ensured, and transverse electric field between the wires can be avoided to avoid a sudden short. Meanwhile, appropriate line widths and line distances allow the first data wires 1530, the second data wires 1630, the third data wires 1730 and the fourth data wires 1820 to be accommodated in the cutting lanes 2200 for the cutting process. Since the first data wires 1530, the second data wires 1630, the third data wires 1730 and the fourth data wires 1820 do not occupy additional spaces, the package quantities made out of a unit carrier board 1100 can be retained, and the best utility rate of the carrier board 1100 can be achieved.

Figure 6:
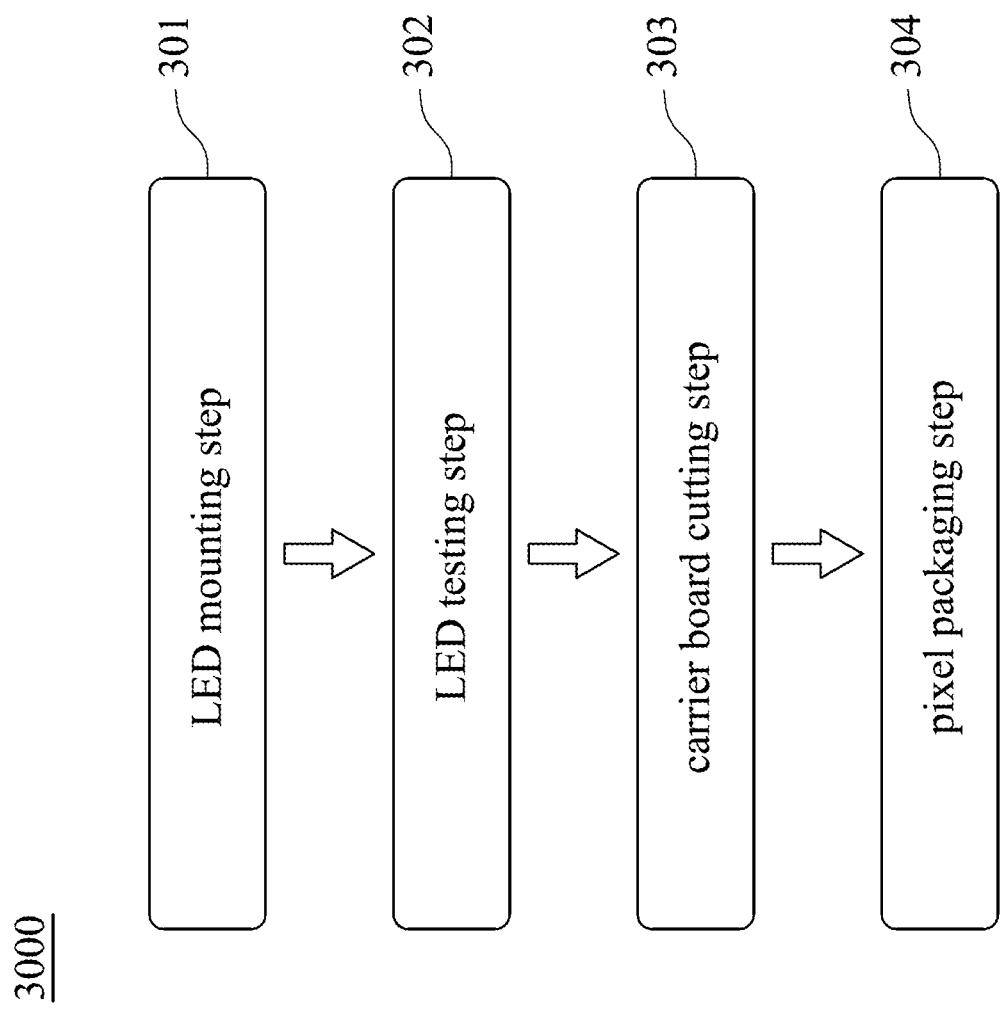
FIG. 6 is a block flow diagram of an LED testing and packaging method according to another embodiment of the present disclosure.
Figure 7:
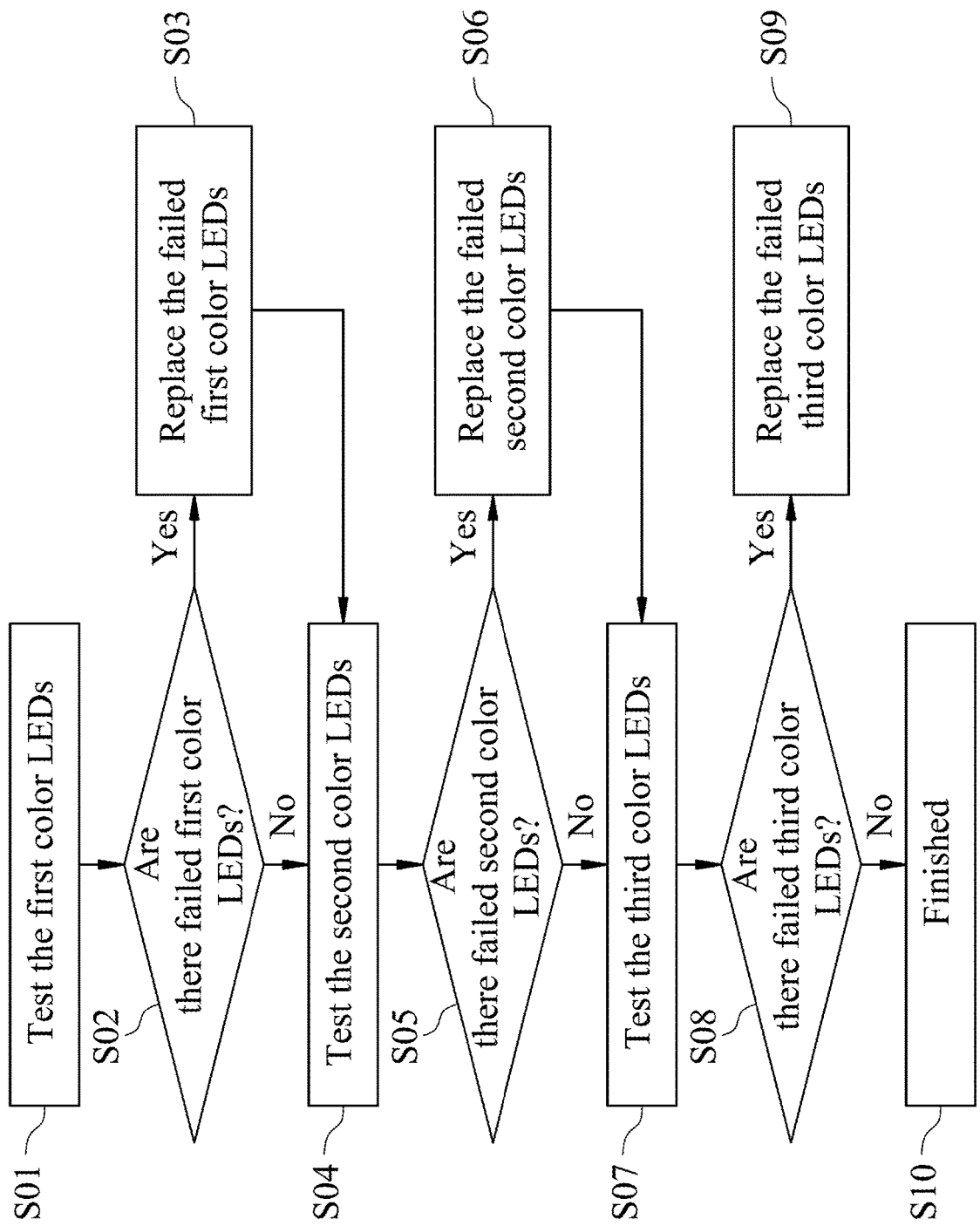
FIG. 7 is a detail flow diagram of the LED testing step according to FIG. 6.
Figure 8:
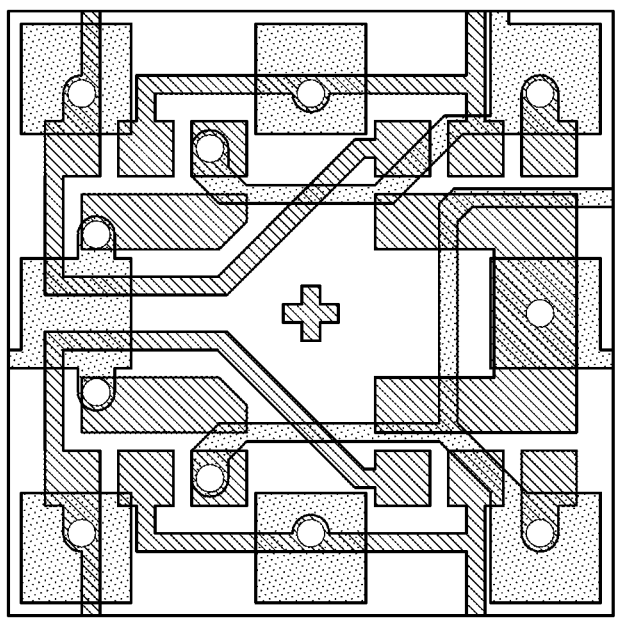
FIG. 8 is a top perspective view of a pixel to be packaged formed after the carrier board is cut in the LED testing and packaging method according to FIG. 6.

FIG. 6 is a block flow diagram of an LED testing and packaging method 3000 according to another embodiment of the present disclosure. FIG. 7 is a detail flow diagram of the LED testing step 302 according to FIG. 6. FIG. 8 is a top perspective view of a pixel to be packaged 2000 formed after the carrier board 1100 is cut in the LED testing and packaging method 3000 according to FIG. 6. In FIG. 6 to FIG. 8, the LED testing and packaging method 3000 includes an LED mounting step 301, an LED testing step 302, a carrier board cutting step 303 and a pixel packaging step 304. In the LED mounting step 301, first color LEDs 1200, second color LEDs 1300 and third color LEDs 1400 are mounted to a circuit board. For example, the LED circuit board structure 1000 of the embodiment in FIG. 1 can be divided into a part including the first color LEDs 1200, the second color LEDs 1300 and the third color LEDs 1400, and a rest part except for the first color LEDs 1200, the second color LEDs 1300 and the third color LEDs 1400 (which can be viewed as the circuit board of this embodiment). In FIG. 1 to FIG. 3 and FIG. 6 to FIG. 8, the circuit board includes a carrier board 1100, a plurality of first wire sets, a plurality of second wire sets and a plurality of cutting lanes 2200. The carrier board 1100 includes a carrying surface 1110 and a bottom surface 1120 opposite to each other. The carrying surface 1110 includes pixel-front-side-pattern regions 1111 disposed in intervals. The bottom surface 1120 includes pixel-back-side-pattern regions 1121 respectively corresponds to the pixel-front-side-pattern regions 1111. At least two first color LED pads 1212, at least two second color LED pads 1312 and at least two third color LED pads 1412 are disposed in one of the pixel-front-side-pattern region 1111. Each of the first color LED pads 1212, each of the second color LED pads 1312 and each of the third color LED pads 1412 are for mounting electrodes with same electric polarity of each of the first color LEDs 1200, each of the second color LEDs 1300 and each of the third color LEDs 1400. The first wire sets each electrically connects the first color LED pads 1212 disposed at the pixel-front-side-pattern regions 1111 in parallel. The second wire sets each electrically connects the second color LED pads 1312 disposed at the pixel-front-side-pattern regions 1111 in parallel. In this embodiment, each first wire set includes first testing wires 1510 and first connecting wires 1520, and each second wire set includes second testing wires 1610 and second connecting wires 1620. The first testing wires 1510 are located at the carrier board 1100, and each first testing wire 1510 electrically connects at least two first color LED pads 1212 located at the same pixel-front-side-pattern region 1111. The first connecting wire 1520 electrically connects two first testing wires 1510 of adjacent two pixel-front-side-pattern regions 1111. The second testing wires 1610 are located at the carrier board 1100, and each second testing wire 1610 electrically connects at least two second color LED pads 1312 located at the same pixel-front-side-pattern region 1111. The second connecting wire 1620 electrically connects two second testing wires 1610 of adjacent two pixel-front-side-pattern regions 1111. The cutting lanes 2200 are located at the carrier board 1100 and are located between each of the pixel-front-side-pattern regions 1111. A part of the first wire sets and a part of the second wire sets are located at the cutting lanes 2200. Especially, the first connecting wires 1520 and the second connecting wires 1620 are located at the cutting lanes 2200. The circuit board further includes third wire sets electrically connect the third color LEDs 1400, and the third wire sets include third testing wires 1710 and third connecting wires 1720, and the details are similar to the above and are not described again hereinafter.

In the LED testing step 302, the first wire sets are powered to test each of the first color LEDs 1200 and the second wire sets are powered to test each of the second color LEDs 1300. The detail flow diagram of the LED testing step 302 is shown in FIG. 7. In step S01, test the first color LEDs 1200 by turns. In step S02, determine whether there are failed first color LEDs 1200. If there are failed first color LEDs 1200, move to step S03, and replace the failed first color LEDs 1200; if there are not failed first color LEDs 1200, move to step S04, and test the second color LEDs 1300 by turns. In step S05, determine whether there are failed second color LEDs 1300. If there are failed second color LEDs 1300, move to step S06, and replace the failed second color LEDs 1300; if there are not failed second color LEDs 1300, move to step S07, and test the third color LEDs 1400 by turns. In step S08, determine whether there are failed third color LEDs 1400. If there are failed third color LEDs 1400, move to step S09, and replace the failed third color LEDs 1400; if there are not failed third color LEDs 1400, move to step S10, and finish the LED testing step 302. In the LED testing step 302 of this embodiment, the first color LEDs 1200, the second color LEDs 1300 and the third color LEDs 1400 can be tested one by one or row/column by row/column.

In the carrier board cutting step 303, the carrier board 1100 is cut along the cutting lanes 2200 such that the pixel-front-side-pattern regions 1111 separate from each other and the first connecting wires 1520 and the second connecting wires 1620 are cut off to form pixels to be packaged 2000 (FIG. 8 shows one of the pixels to be packaged 2000). In the pixel packaging step 304, the separated pixels to be packaged 2000 are sealed to form LED pixel packages.

In the LED testing packaging method 3000, through disposing the first testing wires 1510, the first connecting wires 1520, the second testing wires 1610 and the second connecting wires 1620 on the circuit board, and through executing the carrier board cutting step 303 after the LED testing step 302, signal probes can be easily electrically connected to the electrodes of the LEDs by clipping the fixture on the edge of carrier board 1100, and manual testing is not needed. Through input signal controlling, the first color LEDs 1200, the second color LEDs 1300 and the third color LEDs 1400 can be fast tested one by one or row/column by row/column, and testing efficiency of the LED pixel packages can be improved. In addition, through executing the pixel packaging step 304 after the LED testing step 302, failed first color LEDs 1200, second color LEDs 1300 and third color LEDs 1400 can be found out and replaced timely. Therefore, discarding normal first color LEDs 1200, second color LEDs 1300 and third color LEDs 1400 that are sealed with the failed first color LEDs 1200, second color LEDs 1300 and third color LEDs 1400 can be avoided, and cost can be saved.

Figure 9:
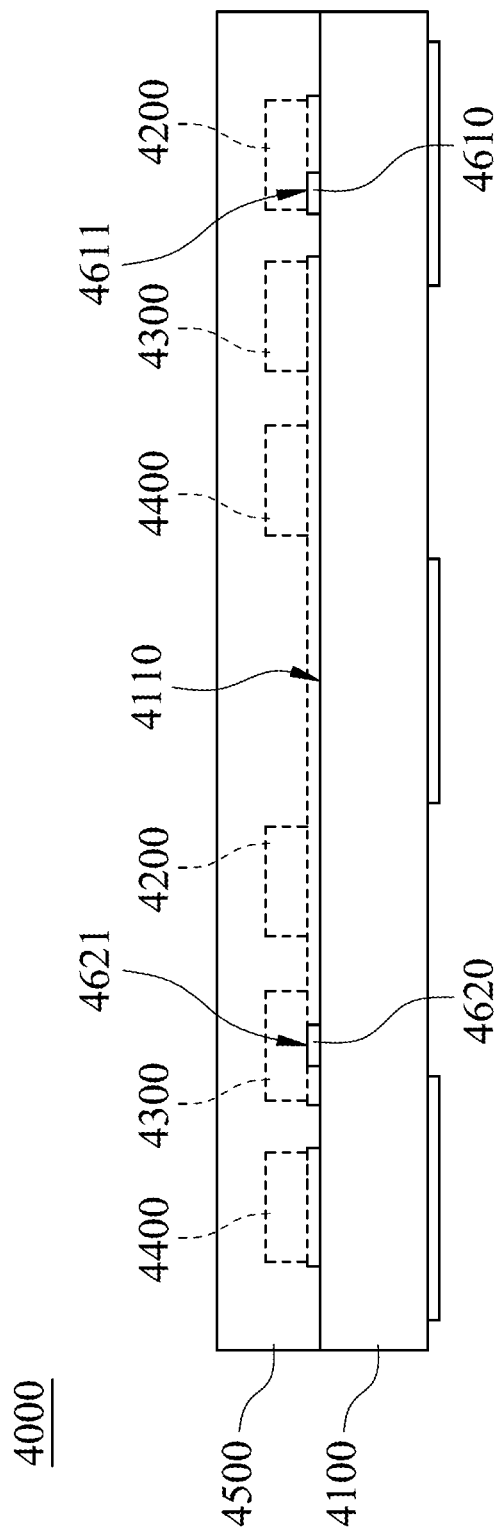
FIG. 9 is a side view of an LED pixel package according to still another embodiment of the present disclosure.

FIG. 9 is a side view of an LED pixel package 4000 according to another embodiment of the present disclosure. Because the wiring structure of the LED pixel package 4000 is the same as the wiring structure in one pixel-front-side-pattern region 1111 and one pixel-back-side-pattern region 1121 in FIG. 1 to FIG. 3, and is the same as the wiring structure of the pixel to be packaged 2000 shown in FIG. 8 as well, only the side view is depicted in FIG. 9. In FIG. 9, the LED pixel package 4000 includes a carrier board 4100, first color LEDs 4200, second color LEDs 4300 and third color LEDs 4400. The first color LEDs 4200, the second color LEDs 4300 and the third color LEDs 4400 are disposed at the carrying surface 4110 of the carrier board 4100. The first wire set 4610 (corresponding to the first testing wires 1510 and the first connecting wires 1520 in FIGS. 1 to 3) is disposed at the carrying surface 4110 and electrically connects at least part of the first color LEDs 4200. A part of the first wire set 4610 extends to the edge of the carrier board 4100. The second wire set 4620 (corresponding to the second testing wires 1610 and the second connecting wires 1620 in FIGS. 1 to 3) is disposed at the carrying surface 4110 and electrically connects at least part of the second color LEDs 4300. A part of the second wire set 4620 extends to the edge of the carrier board 4100. The difference between this embodiment and the embodiment of FIG. 1 to FIG. 3 is that the LED pixel package 4000 includes a sealing layer 4500 covering the first color LEDs 4200, the second color LEDs 4300 and the third color LEDs 4400, and that in the LED pixel package 4000, the first wire set 4610 and the second wire set 4620 are cut off and metal break surfaces at the edge of the carrier board 4100 are formed. Observing from the side of the LED pixel package 4000, the top surface 4611 of the part of the first wire set 4610 that extends to the edge of the carrier board 4100 (especially corresponding to a part of the first connecting wires 1520 in FIG. 1 to FIG. 3) is higher than the carrying surface 4110 of the carrier board 4100, and the top surface 4621 of the part of the second wire set 4620 that extends to the edge of the carrier board 4100 (especially corresponding to a part of the second connecting wires 1620 in FIG. 1 to FIG. 3) is higher than the carrying surface 4110 of the carrier board 4100, and both of the part of the first wire set 4610 and the part of the second wire set 4620 can form metal break surfaces. The third wire set can similarly form a metal break surface at other edges of the carrier board 4100, and the details are not described herein.

In other words, as shown in FIG. 1 to FIG. 3 and FIG. 9, since the first connecting wires 1520 connect first color LEDs 1200 of adjacent pixel-front-side-pattern regions 1111, the first connecting wires are only cut off but not totally removed from the pixel-front-side-pattern regions 1111 after cutting. Therefore, the metal break surfaces are retained at the edge of the carrier board 4100 of the LED pixel package 4000, while the electric characteristics of the LED pixel package 4000 are not affected.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An LED circuit board structure, comprising:
    a plurality of first color LEDs, each of the first color LEDs comprising a first P-type electrode and a first N-type electrode;
    a plurality of second color LEDs, each of the second color LEDs comprising a second P-type electrode and a second N-type electrode;
    a plurality of third color LEDs, each of the third color LEDs comprising a third P-type electrode and a third N-type electrode;
    a carrier board comprising a carrying surface and a bottom surface opposite to each other, the carrying surface comprising a plurality of pixel-front-side-pattern regions disposed in intervals, the bottom surface comprising a plurality of pixel-back-side-pattern regions respectively corresponding to the pixel-front-side-pattern regions, wherein at least two of the first color LEDs, at least two of the second color LEDs and at least two of the third color LEDs are disposed in one of the pixel-front-side-pattern regions, and one of the first color LEDs, one of the second color LEDs and one of the third color LEDs in the one of the pixel-front-side-pattern regions form a sub-pixel;
    a plurality of first testing wires located at the carrier board, each of the first testing wires electrically connecting the at least two of the first color LEDs in each of the pixel-front-side-pattern regions in parallel;
    a plurality of first connecting wires, each of the first connecting wires electrically connecting two of the first testing wires of adjacent two of the pixel-front-side-pattern regions;
    a plurality of second testing wires located at the carrier board, each of the second testing wires electrically connecting the at least two of the second color LEDs in each of the pixel-front-side-pattern regions in parallel;
    a plurality of second connecting wires, each of the second connecting wires electrically connecting two of the second testing wires of adjacent two of the pixel-front-side-pattern regions;

a plurality of third testing wires located at the bottom surface of the carrier board, each of the third testing wires electrically connecting the at least two of the third color LEDs in each of the pixel-front-side-pattern regions in parallel;

a plurality of third connecting wires, each of the third connecting wires electrically connecting two of the third testing wires of adjacent two of the pixel-back-side-pattern regions;

a plurality of front-side electrode pads located at the carrying surface of the carrier board, at least one of the front-side electrode pads located at each of the pixel-front-side-pattern regions, the at least one of the front-side electrode pads in one of the pixel-front-side-pattern regions electrically connecting the first color LED, the second color LED and the third color LED in one of the sub-pixels of the one of the pixel-front-side-pattern regions;

a plurality of conducting holes penetrating the carrier board, wherein an upper end of at least one of the conducting holes is located at each of the pixel-front-side-pattern regions and electrically connecting the at least one of the front-side electrode pads of each of the pixel-front-side-pattern regions, and a lower end of the at least one of the conducting holes is located at each of the pixel-back-side-pattern regions;

a plurality of fourth connecting wires located at the bottom surface of the carrier board, each of the fourth connecting wires electrically connecting the lower ends of the conducting holes of adjacent two of the pixel-back-side-pattern regions; and a plurality of cutting lanes located at the carrier board and located between each of the pixel-front-side-pattern regions, wherein the first connecting wires, the second connecting wires, the third connecting wires and the fourth connecting wires are located at the cutting lanes.

2. The LED circuit board structure of claim 1, wherein a sum of a width of one of the cutting lanes and a width of one of the pixel-front-side-pattern regions defines a pitch, a ratio of the width of one of the cutting lanes and the pitch is in a range of 0.11 to 0.155.

3. The LED circuit board structure of claim 1, further comprising a plurality of first data wires, a plurality of second data wires, a plurality of third data wires and a plurality of fourth data wires respectively electrically connecting the first connecting wires, the second connecting wires, the third connecting wires and the fourth connecting wires, wherein each of the first data wires and each of the second data wires extend to two opposite edges of the carrier board along a first direction and are arranged between the pixel-front-side-pattern regions in intervals in a second direction, and each of the third data wires and each of the fourth data wires extend to another two opposite edges of the carrier board along the second direction and are arranged between the pixel-back-side-pattern regions in intervals in the first direction.

4. The LED circuit board structure of claim 3, wherein line widths of each of the first data wires, each of the second data wires, each of the third data wires and each of the fourth data wires are in a range of 25 μm to 40 μm, and a line distance between one of the first data wires and one of the second data wires that are adjacent to each other, and a line distance of one of the third data wires and one of the fourth data wires that are adjacent to each other are in a range of 40 μm to 50 μm.

5. The LED circuit board structure of claim 1, further comprising a plurality of first electrode pads, a plurality of second electrode pads, a plurality of third electrode pads and a plurality of back-side electrode pads located at the bottom surface of the carrier board, wherein at least one of the first electrode pads, at least one of the second electrode pads, at least one of the third electrode pads and at least one of the back-side electrode pads are located at each of the pixel-back-side-pattern regions, the at least one of the first electrode pads of one of the pixel-back-side-pattern regions electrically connects the at least two of the first color LEDs located at the one of the pixel-front-side-pattern regions, the at least one of the second electrode pads of one of the pixel-back-side-pattern regions electrically connects the at least two of the second color LEDs located at the one of the pixel-front-side-pattern regions, the at least one of the third electrode pads of one of the pixel-back-side-pattern regions electrically connects the at least two of the third color LEDs located at the one of the pixel-front-side-pattern regions, and the at least one of the back-side electrode pad of one of the pixel-back-side-pattern regions electrically connects the at least two of the first color LEDs, the at least two of the second color LEDs and the at least two of the third color LEDs located at the one of the pixel-front-side-pattern regions.

6. An LED testing and packaging method, comprising:

an LED mounting step, wherein a plurality of first color LEDs, a plurality of second color LEDs and a plurality of third color LEDs are mounted to a circuit board, and the circuit board comprising:

a carrier board comprising a carrying surface and a bottom surface opposite to each other, the carrying surface comprising a plurality of pixel-front-side-pattern regions disposed in intervals, the bottom surface comprising a plurality of pixel-back-side-pattern regions respectively corresponding to the pixel-front-side-pattern regions, wherein at least two first color LED pads, at least two second color LED pads and at least two third color LED pads are disposed in one of the pixel-front-side-pattern region, each of the first color LED pads, each of the second color LED pads and each of the third color LED pads are for mounting electrodes with same electric polarity of each of the first color LEDs, each of the second color LEDs and each of the third color LEDs;

a plurality of first wire sets, each of the first wire sets electrically connecting the first color LED pads disposed at the pixel-front-side-pattern regions in parallel;

a plurality of second wire sets, each of the second wire sets electrically connecting the second color LED pads disposed at the pixel-front-side-pattern regions in parallel; and a plurality of cutting lanes located at the carrier board and located between each of the pixel-front-side-pattern regions, wherein a part of the first wire sets and a part of the second wire sets are located at the cutting lanes;

an LED testing step, wherein the first wire sets are powered to test each of the first color LEDs and the second wire sets are powered to test each of the second color LEDs; and a carrier board cutting step, wherein the carrier board is cut along the cutting lanes such that the pixel-front-side-pattern regions separate from each other and the first wire sets and the second wire sets are cut off to form a plurality of pixels to be packaged.

7. The LED testing and packaging method of claim 6, further comprising:
   a pixel packaging step, wherein the separated pixels to be packaged are sealed to form a plurality of LED pixel packages.

* * * * *